United States Patent [19]

Leipold et al.

[11] Patent Number: 4,952,827
[45] Date of Patent: Aug. 28, 1990

[54] CIRCUIT ARRANGEMENT FOR CONTROLLING THE LOAD CURRENT IN A POWER MOSFET

[75] Inventors: Ludwig Leipold; Rainald Sander; Jenoe Tihanyi; Roland Weber, all of Munich, Fed. Rep. of Germany; Nance: Paul, Sunnyvale, Calif.

[73] Assignee: Siemens Aktiengellschaft, Berlin and Munich, Fed. Rep. of Germany

[21] Appl. No.: 438,342

[22] Filed: Nov. 15, 1989

[30] Foreign Application Priority Data

Nov. 15, 1988 [EP] European Pat. Off. ........ 88119041.7

[51] Int. Cl.⁵ ..................... H03K 17/08; H03K 17/16; H03K 17/687/19/094
[52] U.S. Cl. .................................. 307/571; 307/270; 307/296.5; 307/450; 307/300
[58] Field of Search ............... 307/296.2, 296.5, 296.8, 307/280, 450, 270, 571, 300, 570

[56] References Cited

U.S. PATENT DOCUMENTS

| | | | |
|---|---|---|---|
| 4,275,313 | 6/1981 | Boll et al. | 307/270 |
| 4,451,748 | 5/1984 | Amrany | 307/270 |
| 4,477,742 | 10/1984 | Janutka | 307/571 |
| 4,580,070 | 4/1986 | Westman | 307/571 |
| 4,675,561 | 6/1987 | Bowers | 307/270 |
| 4,678,950 | 7/1987 | Mitake | 307/270 |
| 4,801,822 | 1/1989 | Idaka | 307/570 |
| 4,894,568 | 1/1990 | Paulin | 307/570 |

FOREIGN PATENT DOCUMENTS

3034927A1  3/1982  Fed. Rep. of Germany .
3445340    6/1986  Fed. Rep. of Germany .

OTHER PUBLICATIONS

C. R. Hoffman, Constant-Current Source for MOSFET Circuits, p. 2391, vol. 17, No. 8, Jan. 1975.
Article by T. Jones, "Choose the Right F.E.T.", p. 299. Wireless World, Aug., 1974, vol. 30.

*Primary Examiner*—Stanley D. Miller
*Assistant Examiner*—Hanh T. Nguyen
*Attorney, Agent, or Firm*—Hill, Van Santen, Steadman & Simpson

[57] ABSTRACT

A circuit arrangement for controlling load current of a power MOSFET wherein the load is connected at the source terminal includes a second FET having a defined threshold voltage connected with its drain-source path inserted between the gate and source of the power MOSFET. A third FET connects the gate terminal of the second FET to the drain voltage of the power MOSFET when the power MOSFET is in the conductive condition. When the drain-source voltage of the power MOSFET becomes higher than the threshold voltage of the second FET, the second FET becomes conductive and drives the gate-source voltage of the power MOSFET down.

3 Claims, 1 Drawing Sheet

CIRCUIT ARRANGEMENT FOR CONTROLLING THE LOAD CURRENT IN A POWER MOSFET

BACKGROUND OF THE INVENTION

1. Field of the Invention

The present invention is related generally to a circuit arrangement for controlling the load current of a power MOSFET in which the power MOSFET has a load connected in series with its source terminal.

2. Description of the Related Art

It is generally desirable to control or limit the drain current from a power MOSFET so that the MOSFET is not destroyed in case of overload. Since a load is often connected in series with the source terminal of the power MOSFET, it is not possible to undertake control of the load current via the voltage between the gate of the MOSFET and ground.

SUMMARY OF THE INVENTION

An object of the invention is to provide an improved circuit arrangement by which control of current flowing through a power MOSFET is possible with simple means.

This goal is achieved by a circuit arrangement having the following features:

(a) the source-drain terminals of a second MOSFET lie between the gate terminal and the source terminal of the power MOSFET;

(b) the threshold voltage of the second MOSFET is higher than the drain-source voltage drop of the power MOSFET given nominal current;

(c) the gate terminal of the second MOSFET is connected to the source terminal of a third MOSFET whose drain terminal is connected to the drain terminal of the power MOSFET;

(d) the gate terminal of the third MOSFET is connected to the gate terminal of the power MOSFET; and (e) the gate terminal of the second MOSFET is connected to a terminal of a power source whose other terminal lies at a fixed potential.

The invention utilizes the principle that, for example, is known from German published application 30 34 927 in which the drain-source voltage drop of a power MOSFET is utilized as a measurable voltage for drain current. In the known circuit arrangement, a bipolar transistor that is switched on in case of an overload of the power MOSFET and that discharges a gate-source capacitance of the power MOSFET lies between the gate terminal and the source terminal of the power MOSFET. The bipolar transistor does not inhibit, or switch off, again until the control voltage for the power MOSFET is interrupted. The power MOSFET is thereby inhibited, or shut off, in case of overload. There, however, is no control or limitation of the drain current which occurs.

DESCRIPTION OF THE PREFERRED EMBODIMENTS

Figure 1:
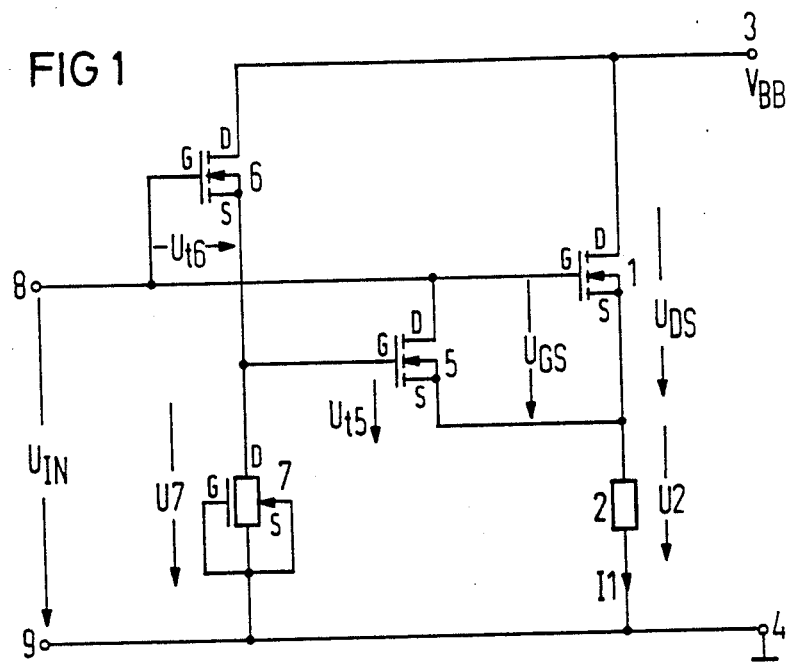
FIG. 1 is a circuit diagram showing a circuit arrangement according to the principles of the present invention.

A circuit arrangement is shown in FIG. 1 containing a power MOSFET 1 having a load 2 connected in series with a source terminals of the power MOSFET 1. The series connected circuit lies at an output formed of two output leads or posts, 3 and 4 to which a supply voltage $V_{ss}$ is connected. A second MOSFET 5 has its drain-source path connected between a gate terminal G and the source terminal S of the power MOSFET 1. The series circuit of the power MOSFET 1 and the load 2 has a further series circuit of a third MOSFET 6 and current source 7 connected parallel thereto. The current source 7 is a field effect transistor having its gate lead connected to the source lead in the illustrated embodiment. Such a courrent source is well known e.g. from U.S. Pat. No. 4,578,596. A drain terminal D of the third MOSFET 6 is connected to the drain terminal D of the power MOSFET 1. The junction between the third MOSFET 6 and the current source 7 is connected to a gate terminal G of the second MOSFET 5. The other terminal of the current source 7 is connected to the output lead 4, which lies at a fixed potential that is, for example, at ground potential. Gate terminals G of the third MOSFET 6 and the power MOSFET 1 are connected in common to an input lead 8. Another input lead 9 lies at, for example, ground potential.

For the following explanation of the operation of the illustrated circuit, it is assumed that an input voltage $U_{IN}$ is applied between the input leads 8 and 9. When the input voltage $U_{IN}$ reaches a threshold voltage of the power MOSFET 1, then the power MOSFET 1 begins to conduct since its source terminal S initially still lies at ground potential. The gate terminal G of the second MOSFET 5 likewise lies at ground potential via the current source 7. The second MOSFET 5, therefore, remains inhibited, or switched off. As the input voltage $U_{IN}$ is increased, the power MOSFET 1 conducts current to a greater extent whereby its source potential follows the gate potential. The gate potential of the second MOSFET 5, which lies at a voltage U7 across the current source 7 and likewise follows the input voltage $U_{IN}$ and is lower than the input voltage $U_{IN}$ by a threshold voltage $U_{t6}$ of the third MOSFET 6. When the input voltage $U_{IN}$ reaches a value that is higher than the sum of the supply voltage $V_{BB}$ and the threshold voltage $U_{t6}$, then the third MOSFET 6 is fully switched on and the voltage appearing at the output lead 3, which is the supply voltage $V_{BB}$, is applied to the gate G of the second MOSFET 5.

A voltage $U_{GS}$ which derives from the difference between the input voltage $U_{IN}$ and the voltage drop U2 across the load 2 now lies at the input of the power MOSFET 1. The voltage $U_{GS}$ is of such dimensions that it drives the power MOSFET 1 to a completely transmissive state. In this condition, a current I1 that corresponds to a nominal current flows through the power MOSFET 1 The voltage $U_{GS}$ is expediently dimensioned such that the operating point for the current I1 lies at an upper end of a linear region of the $I_D/U_{DS}$ characteristic as shown in FIG. 2.

In case of an overload or of a short of the load 2, the transistor current I1 rises. The voltage drop $U_{DS}$ across the power MOSFET 1 thus also increases. When the voltage drop $U_{DS}$ becomes higher than the threshold voltage $U_{t5}$ of the second MOSFET 5, then the second MOSFET 5 begins to conduct. The control voltage $U_{GS}$ of the power MOSFET 1 is thus reduced until the voltage $U_{DS}$ is again equal to the threshold voltage $U_{t5}$. The reduction of the voltage $U_{GS}$ corresponds to the reduction of the drain current $I_D$. The amplitude of the control voltage $U_{GS}$ is limited to the sum of the threshold voltages $U_{t5}$ plus $U_{t6}$ of the second and third MOSFETs 5 AND 6.

Figure 2:
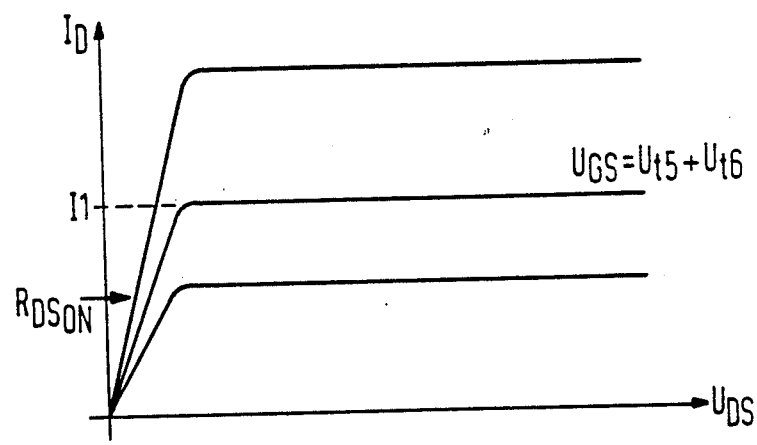
FIG. 2 is a graph showing a characteristics field of the drain current over drain-source voltage of a power MOSFET.

The sum of the threshold voltages $U_{t5}$ plus $U_{t6}$ is expediently selected such that the aforementioned operating point, given nominal current I1, is set in the characteristics field as shown in FIG. 2 to lie at the salient point between the linear region and the saturation region. By selection the threshold voltage $U_{t5}$, the value of the voltage $U_{DS}$ across the power MOSFET 1 at which the downward control of the control voltage should begin can be determined. In addition to being achieved by modification of the design parameters of the third MOSFET 6, a modification of the threshold voltage $U_{t6}$ can be achieved by modifying the current source 7 since the threshold voltage $U_{t6}$ is a function of the drain current of the third MOSFET 6.

Thus, there has been shown and described a circuit for controlling a power MOSFET wherein the drain-source path of the second FET having a defined threshold voltage is inserted between the gate and source of the power MOSFET. In the conductive condition of the power MOSFET, the gate terminal of the second FET lies at the gate potential of the power MOSFET via a third MOSFET. When the drain-source voltage of the power MOSFET becomes higher than the threshold voltage of the second FET, the later becomes conductive and drives the gate-source voltage of the power FET down.

Although other modifications and changes may be suggested by those skilled in the art, it is the intention of the inventors to embody within the patent warranted hereon all changes and modifications as reasonably and properly come within the scope of their contribution to the art.

We claim:

1. A circuit arrangement for controlling a load current from a power MOSFET to a load connected in series with a source terminal of the power MOSFET, comprising:

a second MOSFET having a drain-source path connected between a gate terminal and a source terminal of the power MOSFET, said second MOSFET having a threshold voltage that is higher than a drain-source voltage drop of the power MOSFET at nominal current;

a third MOSFET having a source terminal connected to a gate terminal of said second MOSFET and having a drain terminal connected to a drain terminal of the power MOSFET, said third MOSFET having a gate terminal connected to the gate terminal of the power MOSFET; and a current source having first terminal connected to a gate terminal of said second MOSFET, said current source having a second terminal connected to a fixed potential.

2. A circuit arrangement as claimed in claim 1, wherein said second and third MOSFETs have threshold voltages selected such that a sum of the threshold voltages of the second and third MOSFETs enable the power MOSFET to operate at a point at an upper end of a linear region of a drain current/drain-source voltage characteristic field at a prescribed nominal current.

3. A circuit arrangement for connection to a power MOSFET to control load current from a source terminal of the power MOSFET to control load current from a source terminal of the power MOSFET to a load, comprising:

a second FET having a threshold voltage and being connected with its drain-source path between a gate and a source of the power MOSFET;

a third FET having a threshold voltage and having its gate connected to a gate of the power MOSFET, a drain-source path of said third FET being connected between a drain of the power MOSFET and a gate of said second FET;

a current source connected between said gate of said second FET and ground; and said threshold voltages of said second and third FETs being such that a sum thereof places a nominal current of the power MOSFET at an upper region of a drain current/drain-source voltage characteristic field.

* * * * *